United States Patent
Shim et al.

(10) Patent No.: US 10,734,058 B2
(45) Date of Patent: Aug. 4, 2020

(54) MEMORY DEVICE DETECTING AND CORRECTING DATA ERROR AND OPERATING METHOD THEREOF

(71) Applicant: SK hynix Inc., Gyeonggi-do (KR)

(72) Inventors: Seok-Bo Shim, Gyeonggi-do (KR); Sang-Ho Lee, Chungcheongbuk-do (KR); Seok-Cheol Yoon, Seoul (KR); Yun-Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 61 days.

(21) Appl. No.: 16/046,266

(22) Filed: Jul. 26, 2018

(65) Prior Publication Data

US 2019/0221248 A1 Jul. 18, 2019

(30) Foreign Application Priority Data

Jan. 16, 2018 (KR) .................. 10-2018-0005640

(51) Int. Cl.
| | | |
|---|---|---|
| *G11C 11/406* | (2006.01) | |
| *G11C 11/408* | (2006.01) | |
| *G11C 29/52* | (2006.01) | |
| *G06F 11/10* | (2006.01) | |
| *G11C 7/10* | (2006.01) | |
| *G11C 29/04* | (2006.01) | |
| *G11C 11/4096* | (2006.01) | |

(52) U.S. Cl.
CPC ........ *G11C 11/406* (2013.01); *G06F 11/1068* (2013.01); *G11C 7/1063* (2013.01); *G11C 11/408* (2013.01); *G11C 11/40611* (2013.01); *G11C 29/52* (2013.01); *G11C 7/1006* (2013.01); *G11C 11/4096* (2013.01); *G11C 2029/0409* (2013.01); *G11C 2029/0411* (2013.01); *G11C 2211/4062* (2013.01)

(58) Field of Classification Search
CPC ...................................... G11C 11/406
USPC ......................... 714/764, 770, 773
See application file for complete search history.

(56) References Cited

U.S. PATENT DOCUMENTS

| | | | | |
|---|---|---|---|---|
| 4,887,235 A | * | 12/1989 | Holloway | ............... G06F 8/312 |
| | | | | 711/216 |
| 2004/0117723 A1 | * | 6/2004 | Foss | .................... G06F 11/1044 |
| | | | | 714/805 |
| 2016/0055056 A1 | * | 2/2016 | Son | ..................... G06F 11/1068 |
| | | | | 714/764 |
| 2019/0294374 A1 | * | 9/2019 | Choi | ....................... G11C 29/42 |

FOREIGN PATENT DOCUMENTS

| | | |
|---|---|---|
| KR | 1020100065446 | 6/2010 |
| KR | 1020140125981 | 10/2014 |
| KR | 1020160138690 | 12/2016 |

* cited by examiner

*Primary Examiner* — Fritz Alphonse
(74) *Attorney, Agent, or Firm* — IP & T Group LLP

(57) ABSTRACT

A memory device includes an error correction code (ECC) block suitable for performing an ECC operation, and generating a flag signal when an error is detected and corrected through the ECC operation in data read from a memory cell array, and a refresh control block suitable for comparing an active row address with a target address in response to the flag signal, and refreshing data of a neighboring address of the target address based on a comparison result.

18 Claims, 3 Drawing Sheets

MEMORY DEVICE DETECTING AND CORRECTING DATA ERROR AND OPERATING METHOD THEREOF

CROSS-REFERENCE TO RELATED APPLICATIONS

This application claims priority under 35 U.S.C. § 119 to Korean Patent Application No. 10-2018-0005640, filed on Jan. 16, 2018, which is incorporated herein by reference in its entirety.

BACKGROUND

1. Field

Various exemplary embodiments of the present invention relate to a semiconductor design technique, and more particularly, to a semiconductor device that detects and corrects data errors and an operating method thereof.

2. Description of the Related Art

A memory device, such as, e.g., a Dynamic Random-Access Memory (DRAM), may include a plurality of memory cells that are arrayed in the form of a matrix. As the capacity of memory devices increases and the dimension of fabricated memory devices shrinks, the number of defective memory cells among the memory cells increases as well. In general, defective memory cells may include failed memory cells and weak memory cells. The failed memory cells may be defined as memory cells that do not function in terms of hardware. For example, the failed memory cells may be defined as the memory cells that do not operate due to a defect occurring during the semiconductor fabrication process, such as a memory cell of which the connection line is short-circuited. The weak memory cells may be defined as memory cells that do not function in terms of software. For example, the weak memory cells may include a memory cell of which the data retention time does not reach a reference time.

In recent times, data retention characteristics of a memory cell tend to decrease due to the trend of low-voltage high-speed operation and shrinking fabrication dimensions that may also lead to an increase in the number of weak memory cells. In other words, the frequency that error bits intermittently occur in the data stored in a DRAM is increasing drastically. To solve the problem, there is an effort for detecting and correcting the error bits through an Error Correction Code (ECC) operation inside of the DRAM.

Meanwhile, as the degree of integration of a memory device increases, the space between a plurality of word lines included in the memory device is reduced, and the coupling effect between adjacent word lines increases. As a result, if a specific word line is activated too often or frequently, the data of memory cells coupled to a word line adjacent to the specific word line may be corrupted.

When a specific word line is repeatedly activated in a time threshold value, that is, when the specific word line is hammered or a row hammer event occurs, data of memory cells electrically coupled to word lines, which are physically adjacent to the specific word line, may be affected. A leakage current and a parasitic current caused by repeated access to a specific word line may drift data corresponding to non-accessed word lines physically adjacent to the specific word line. Such drift, influence and the like of the data between word lines are herein referred to as a row disturbance phenomenon.

Particularly, when error bits that can be detected and corrected through the ECC operation meet the condition for the row hammer event, the error bits increase and consequently, there is a high possibility that the error bits become uncorrectable error bits. Although a memory device can reduce the influence of memory cells due to the hammered word line through a refresh operation, there is a limitation in increasing the frequency of the refresh operation for a specific word line in a system in which the refresh operation interval is short, such as a mobile device. Therefore, even in case of the error bits that can be detected and corrected through the ECC operation, it is desirable to develop a method for further increasing the reliability of data according to the refresh operation condition.

SUMMARY

Various embodiments of the present invention are directed to a memory device capable of providing a more improved stability of data by performing a refresh operation based on a result of an ECC operation, and an operating method of the memory device.

In accordance with an embodiment of the present invention, a memory device includes: an error correction code (ECC) block suitable for performing an ECC operation, and generating a flag signal when an error is detected and corrected through the ECC operation in data read from a memory cell array; and a refresh control block suitable for comparing an active row address with a target address in response to the flag signal, and refreshing data of a neighboring address of the target address based on a comparison result.

In accordance with an embodiment of the present invention, an operating method of a memory device includes: detecting and correcting an error of data stored in a memory cell array through an ECC operation; comparing an address of the data where the error is detected and corrected with a target address; and refreshing data of first and second neighboring addresses of the target address when the address of the data where the error is detected and corrected is the first neighboring address of the target address as a comparison result.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details.

The drawings are not necessarily to scale and, in some instances, proportions may have been exaggerated in order to clearly illustrate features of the embodiments.

Figure 1:
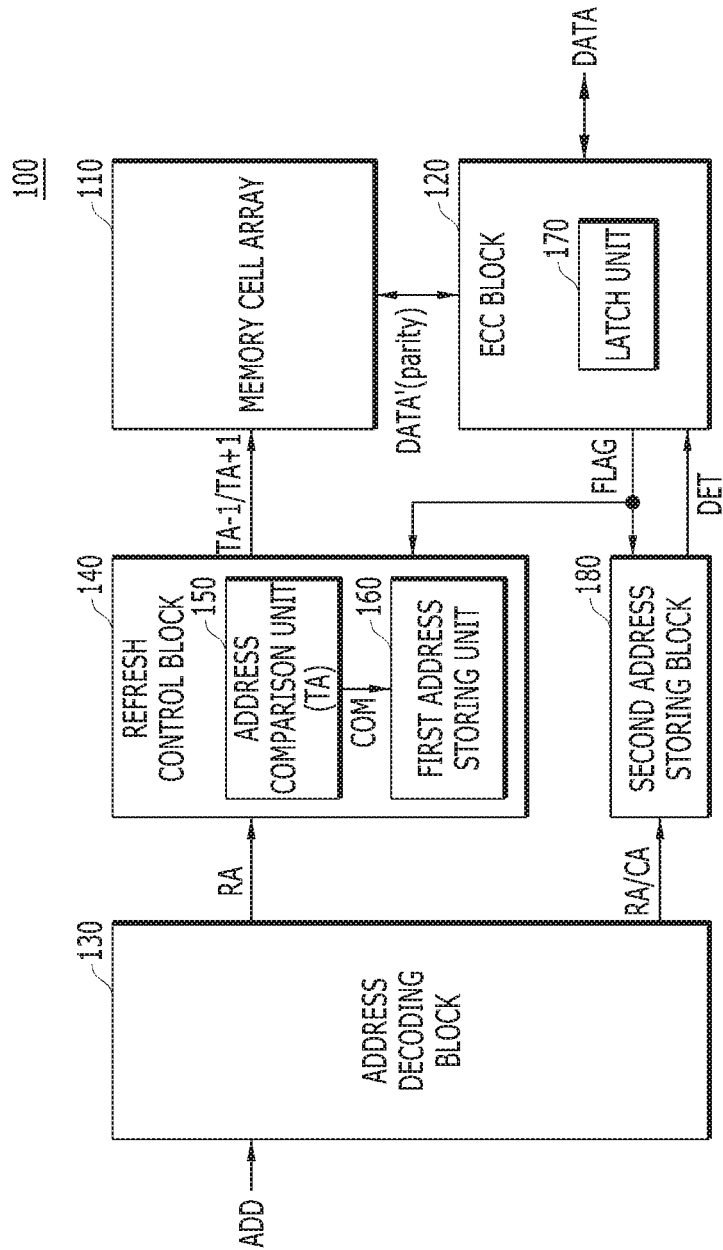
FIG. 1 is a block diagram illustrating a memory device in accordance with an embodiment of the present invention.

FIG. 1 is a block diagram illustrating a memory device 100 in accordance with an embodiment of the present invention. FIG. 1 representatively shows only the configurations related to a refresh operation and an ECC operation among various configurations included in the memory device 100. Referring to FIG. 1, the memory device 100 may include a memory cell array 110, an error correction code (ECC) block 120, an address decoding block 130, and a refresh control block 140. The error correction code block 120, the address decoding block 130, and the refresh control block 140 may include all circuits, systems, software, firmware and devices necessary for their respective operations and functions.

The memory cell array 110 may include a plurality of memory cells arranged in a form of a matrix. In other words, the memory cell array 110 may include the plurality of memory cells arranged in row and column directions. Memory cells arranged in the row direction in the memory cell array 110 may be electrically connected to word lines and memory cells arranged in the column direction may be electrically connected to bit lines.

The ECC block 120 may perform an ECC operation of the memory device 100. In order to detect and correct an error of data stored in the memory cell array 110, the ECC block 120 may generate parity data of data DATA provided from an external device. The ECC block 120 may provide ECC encoded data DATA'(parity) together with the parity data to the memory cell array 110.

During a read operation, the ECC block 120 may detect and correct the error from the data DATA'(parity) read from the memory cell array 110, based on the parity data. The ECC block 120 may output the data DATA whose error is detected and corrected to the external device. When the error is detected from the data DATA'(parity) and the detected error is corrected, the ECC block 120 may generate a flag signal FLAG.

The address decoding block 130 may decode an address ADD inputted from the external device to generate a row address RA and a column address CA. Although not illustrated, the memory device 100 may further include a word line driving circuit or a column selection circuit corresponding to the memory cell array 110. The word line driving circuit may select a word line of the memory cell array 110 based on the row address RA. The column selection circuit may select a memory cell to which data is read or written from memory cells coupled to a selected word line based on the column address CA.

The refresh control block 140 may control a refresh operation for the memory cells arranged in the row direction in the memory cell array 110. The refresh control block 140 may count the row address RA generated from the address decoding block 130, that is, the row address RA which is activated (hereinafter referred to as an "active row address RA"). The refresh control block 140 may store the row address RA which is counted a predetermined number of times or more as a target address TA.

When the flag signal FLAG is inputted from the ECC block 120, the refresh control block 140 may compare the active row address RA with the target address TA. The refresh control block 140 may refresh data of a neighboring address of the target address TA based on a result of the comparison. Specifically, when the active row address RA is a first neighboring address TA−1 or TA+1 of the target address TA, the refresh control block 140 may refresh data of the first neighboring address and a second neighboring address TA−1 and TA+1 of the target address TA.

In other words, when the active row address RA is smaller than the target address TA by "1" (RA=TA−1), the refresh control block 140 may generate the active row address RA and a row address RA+2 obtained by increasing "2" from the active row address RA as the first and second neighboring addresses TA−1 and TA+1 for the refresh operation. On the contrary, when the active row address RA is greater than the target address TA by "1" (RA=TA+1), the refresh control block 130 may generate the active row address RA and a row address RA−2 obtained by decreasing "2" from the active row address RA as the first and second neighboring addresses TA−1 and TA+1 for the refresh operation, As described above, the target address TA refers to a word line which is activated a predetermined number of times or more. Accordingly, two addresses TA−1 and TA+1 adjacent to the target address TA represent word lines adjacent to a hammered word line, that is, word lines where a row disturbance phenomenon may occur. When error bits occur in data read from memory cells coupled to the word lines, the error bits may be within a range capable of being detected and corrected by the ECC block 120, however, the range is highly likely to be extended due to successive operations. According to an embodiment of the present invention, when an address of data whose error is detected and corrected by the ECC block 120 is a neighboring address of a row address which is frequently activated, the refresh operation may be promptly performed onto the address and another neighboring address, thereby preventing error bits from increasing.

The refresh control block 140 may include an address comparison unit 150 and a first address storing unit 160. The address comparison unit 150 and the first address storing unit 160 may include all circuits, systems, software, firmware and devices necessary for their respective operations and functions. In response to the flag signal FLAG, the address comparison unit 150 may compare the active row address RA with the first and second neighboring addresses TA−1 and TA+1. When the active row address RA does not coincide with the first and second neighboring addresses TA−1 and TA+1, the address comparison unit 150 may generate a comparison signal COM.

The first address storing unit 160 may store the active row address RA in response to the comparison signal COM. That is, when the active row address RA is not the first and second neighboring addresses TA−1 and TA+1, the first address storing unit 160 may additionally store the active row address RA.

When the row address stored in the first address storing unit 160 exceeds a predetermined number, the refresh control block 140 may additionally refresh data of the row address stored in the first address storing unit 160. The refresh control block 140 may output the row address stored in the first address storing unit 160 as an address for the refresh operation. Accordingly, the refresh operation may be performed at predetermined periods even onto data whose error is detected and corrected but that is not affected by the row disturbance phenomenon.

According to an embodiment of the present invention, the ECC block 120 may include a latch unit 170. The ECC block 120 may store the data whose error is detected and corrected through the ECC operation in the latch unit 170. The data stored in the latch unit 170 may be data corresponding to bits whose error is detected and corrected among the data DATA. The latch unit 170 may include all circuits, systems, software, firmware and devices necessary for its operations and functions.

When one row, that is, a word line is activated in the memory cell array 110, memory cells of a predetermined unit among memory cells coupled to the active word line may be accessed to read/write data. In other words, in order to support a burst length (BL) corresponding to a maximum number of accessible column locations, bit lines corresponding to the BL may be simultaneously accessed.

For example, when the BL is set to be equal to "8" in the memory device where 64-bit data is read/written, the ECC block 120 may perform the ECC operation of detecting and correcting a 1-bit error for each 8-bit data. Accordingly, parity data may be added to each of the 8-bit data by 1 bit so that entire 8-bit parity data may be used. The ECC block 120 may detect the 1-bit error and store the corrected data in the latch unit 170. The latch unit 170 may be included in the memory device 100 outside of the ECC block 120, and the present invention is not limited thereto. The latch unit 170 may include a content addressable memory (CAM)

The memory device 100 may further include a second address storing block 180 to store an address of the data stored in the latch unit 170. The second address storing block 180 may include all circuits, systems, software, firmware and devices necessary for its operations and functions.

When the error is detected and corrected by the ECC block 120, the flag signal FLAG may be generated, and the second address storing block 180 may store the active row and column addresses RA and CA in response to the flag signal FLAG. According to the aforementioned example, the active row address RA may refer to an address corresponding to a single active word line, and the active column address CA may refer to an address corresponding to the bit lines which are simultaneously accessed.

The second address storing block 180 may compare the active row and column addresses RA and CA with previously-stored addresses during successive operations. When the active row and column addresses RA and CA coincide with the previously-stored addresses, the second address storing block 180 may generate a detection signal DET. In response to the detection signal DET, the ECC block 120 may perform the ECC operation based on the data stored in the latch unit 170. Consequently, the memory device 100 in accordance with an embodiment of the present invention may store the data whose error is detected and corrected through the ECC operation, and replace data of a memory cell using the stored data.

Figure 2:
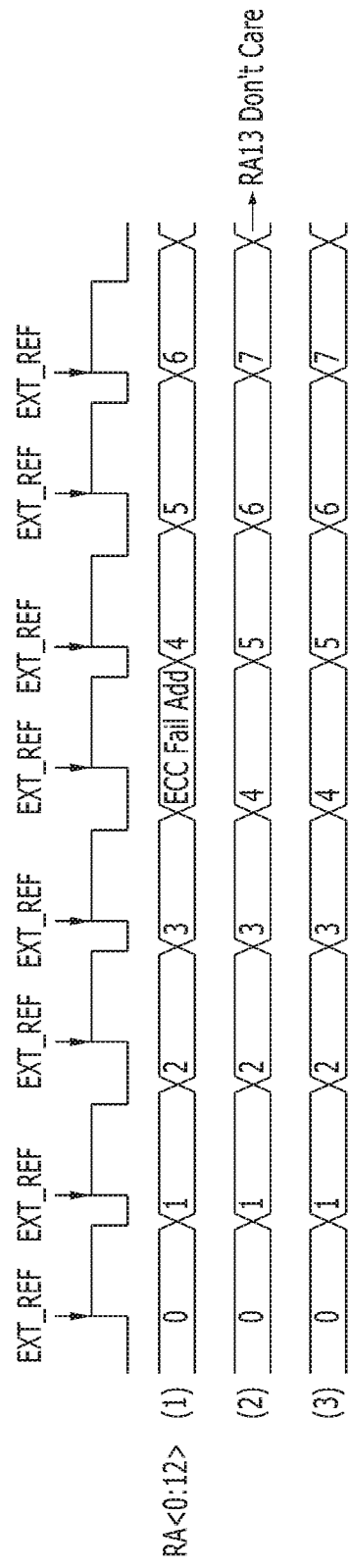
FIG. 2 is a timing diagram illustrating a refresh operation of the memory device shown in FIG. 1.

FIG. 2 is a timing diagram illustrating the refresh operation of the memory device 100 shown in FIGS. 1. (1) and (2) shown in FIG. 2 represent cases where an ECC error is detected, and (3) shown in FIG. 2 represents a case where the ECC error is not detected.

Referring to case (3) of FIG. 2, the memory device 100 may perform the refresh operation by continuously counting row addresses RA<0:12> in response to a refresh command EXT_REF. When the ECC error is detected, a first method (1) or a second method (2) may be applied. In the first method (1), the refresh operation may be additionally performed onto an address in which an error occurs (ECC Fail Add) between periods where a normal refresh command operation is performed. In the second method (2), the refresh operation may be performed in parallel onto the address in which the error occurs when a word line is activated based on the normal refresh command operation.

In case of the first method (1), when the address in which the ECC error is detected is a neighboring address of a target address, the refresh operation may be additionally performed onto the neighboring address without an increase in a count of the row addresses RA<0:12>. In other words, a count of a row address RA<4> may be interrupted, and the refresh operation may be promptly performed onto the neighboring address of the target address.

In case of the second method (2), while increasing the count of the row addresses RA<0:12> continuously, the word line of the address in which the ECC error is detected may be additionally refreshed regardless of a row address RA13 ("Don't Care") during the refresh operation based on the refresh command EXT_REF. In other words, the address having the ECC error detected and other than the neighboring address of the target address may be stored, and then the refresh operation may be performed on by activating the word line of the stored address in parallel for a predetermined period.

Figure 3:
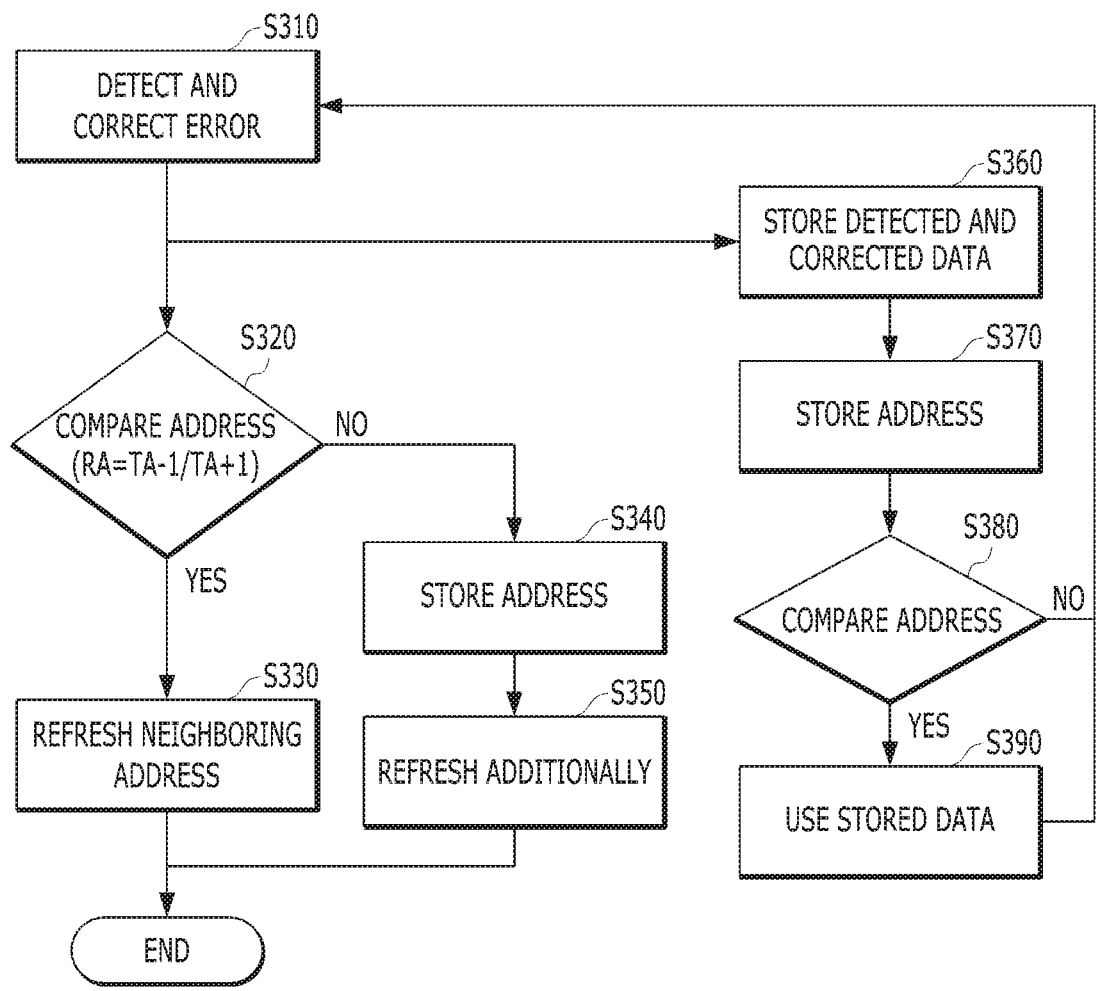
FIG. 3 is a flowchart illustrating an operation of a memory device in accordance with an embodiment of the present invention.

FIG. 3 is a flowchart illustrating an operation of the memory device 100 in accordance with an embodiment of the present invention.

In step S310, the ECC block 120 may detect and correct an error of the data DATA'(parity) stored in the memory cell array 110 through an ECC operation. The ECC block 120 may detect the error occurring in the data DATA'(parity) read from the memory cell array 110, and correct the detected error. When the error occurring in the data DATA' (parity) is detected and corrected, the ECC block 120 may generate the flag signal FLAG.

In step S320, the address comparison unit 150 may compare an address of the data whose error is detected and corrected by the ECC block 120 with a target address TA. In response to the flag signal FLAG, the address comparison unit 150 may check whether an active row address RA is a first neighboring address TA−1 (or TA+1) of the target address TA. The refresh control block 140 may count the active row address RA and store the row address RA which is counted a predetermined number of times or more as the target address TA.

When the address of the data whose error is detected and corrected is the first neighboring address TA−1 (or TA+1) of the target address TA as a result of the comparison of the address comparison unit 150 (that is, "YES" in step S320), the refresh control block 140 may refresh data of the first neighboring address TA−1 (or TA+1) and a second neighboring address TA+1 (or TA−1) of the target address in step S330. In other words, when the active row address RA coincides with the first or second neighboring address TA−1 or TA+1 of the target address TA, the refresh control block 140 may generate the first and second neighboring addresses TA−1 and TA+1 of the target address TA to perform the refresh operation.

When the address of the data whose error is detected and corrected is not the first or second neighboring address TA−1 or TA+1 of the target address TA as a result of the comparison of the address comparison unit 150 (that is, "NO" in step S320), the first address storing unit 160 may additionally store the address of the data whose error is detected and corrected in step S340. In other words, when the active row address RA does not coincide with the first or second neighboring address TA−1 or TA+1 of the target address TA, the first address storing unit 160 may store the active row address RA.

When the address stored in the first address storing unit 160 exceeds a predetermined number, the refresh control block 140 may additionally refresh the data of the address stored in the first address storing unit 160 in step S350. That is, the refresh control block 140 may activate in parallel a word line corresponding to the address stored in the first address storing unit 160 at a predetermined period to perform the refresh operation.

According to an embodiment of the present invention, the ECC block 120 may store the data whose error is detected and corrected in the latch unit 170 in step S360. As described earlier, the ECC block 120 may generate the flag signal FLAG while storing the data whose error is detected and corrected in the latch unit 170.

In step S370, the second address storing block 180 may store row and column addresses of the data stored in the latch unit 170 by the ECC block 120. When the flag signal FLAG is generated by the ECC block 120, the second address storing block 180 may store the active row and column addresses RA and CA.

When the memory device 100 continues to perform the ECC operation, the second address storing block 180 may compare the active row and column addresses RA and CA with previously-stored addresses in step S370. When the active row and column addresses RA and CA coincide with the stored addresses (that is, "YES" in step S380), the ECC block 120 may perform the ECC operation using the data stored in the latch unit 170 in step S390. When the active row and column addresses RA and CA do not coincide with the stored addresses (that is, "NO" in step S380), the ECC block 120 may perform the ECC operation based on the data to be read/written.

As is apparent from the above descriptions, in the memory device and the operating method thereof in accordance with embodiments of the present invention, a refresh operation may be additionally performed onto an address where an ECC error occurs during a normal refresh operation or a refresh operation may be performed in parallel to an original refresh operation when a specific number of ECC errors occur. As a result, it is possible to make the performance of the refresh operation better when an ECC is used. In addition, a period of the refresh operation may be further increased when there is a margin to data retention time of memory cells such as a situation of a room temperature, and as a result, an operational current of the memory device may be reduced.

In accordance with the embodiments of the present invention, a memory device may additionally perform a refresh operation onto a memory cell of data whose error is detected through an ECC operation. In this case, the memory device may perform the refresh operation onto a neighboring memory cell as well as the memory cell of the data whose error is detected based on information for a memory cell which is frequently accessed. Consequently, the data may be retained safely.

Therefore, as the refresh operation is performed onto the data whose error can be detected and corrected through the ECC operation but is likely to deteriorate, the reliability of the data may increase. That is, as the ECC operation is applied, a performance of the refresh operations, for example, a smart refresh operation, for preventing a row disturbance phenomenon may be improved, and a period of the refresh operation may be increased. In addition, when the ECC operation is performed, the data whose error is detected and corrected may be stored, and data of the memory cell may be replaced using the stored data. Consequently, the efficiency of the ECC operation may be increased.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A memory device, comprising:
    an error correction code (ECC) block suitable for performing an ECC operation, and generating a flag signal when an error is detected and corrected through the ECC operation in data read from a memory cell array; and
    a refresh control block suitable for comparing an active row address with a target address in response to the flag signal, and refreshing data of a neighboring address of the target address based on a comparison result,
    wherein when the active row address is a first neighboring address of the target address, the refresh control block refreshes data of the first neighboring address and a second neighboring address of the target address.

2. The memory device of claim 1, wherein the refresh control block includes:
    an address comparison unit suitable for comparing the active row address with the first and second neighboring addresses in response to the flag signal, and generating a comparison signal when the active row address is different from the first and second neighboring addresses; and
    a first address storing unit suitable for storing the active row address in response to the comparison signal.

3. The memory device of claim 2, wherein when the number of row addresses stored in the first address storing unit exceeds a predetermined number, the refresh control block additionally refreshes data of the row addresses stored in the first address storing unit.

4. The memory device of claim 1, wherein when the active row address is smaller than the target address by "1", the refresh control block generates the active row address and an address obtained by increasing "2" from the active row address as the first and second neighboring addresses.

5. The memory device of claim 1, wherein when the active row address is greater than the target address by "1", the refresh control block generates the active row address and an address obtained by decreasing "2" from the active row address as the first and second neighboring addresses.

6. The memory device of claim 1, wherein the refresh control block counts the active row address, and stores a row address which is counted a predetermined number of times or more, as the target address.

7. The memory device of claim 1, wherein the ECC block stores data where the error is detected and corrected.

8. The memory device of claim 7, further comprising:
a second address storing block suitable for storing active row and column addresses in response to the flag signal.

9. The memory device of claim 8, wherein the second address storing block compares the active row and column addresses with the stored addresses, and generates a detection signal based on a comparison result.

10. The memory device of claim 9, wherein the ECC block performs the ECC operation based on the stored data in response to the detection signal.

11. An operating method for a memory device, comprising:
detecting and correcting an error of data stored in a memory cell array through an ECC operation at an ECC block;
comparing an active row address of the data where the error is detected and corrected with a target address at an address comparison unit of a refresh control block; and
refreshing data of first and second neighboring addresses of the target address when the active row address of the data where the error is detected and corrected is the first neighboring address of the target address as a comparison result at the refresh control block.

12. The operating method of claim 11, further comprising:
storing the active row address of the data where the error is detected and corrected when the active row address of the data where the error is detected and corrected is not the first or second neighboring address of the target address as the comparison result.

13. The operating method of claim 12, further comprising:
additionally refreshing data of stored addresses when the number of the stored addresses exceed a predetermined number.

14. The operating method of claim 11, further comprising:
counting the active row address; and
storing a row address which is counted a predetermined number of times or more as the target address.

15. The operating method of claim 11, further comprising:
storing the data where the error is detected and corrected.

16. The operating method of claim 15, further comprising:
storing row and column addresses of the stored data.

17. The operating method of claim 16, further comprising:
comparing the active row and column addresses with the stored addresses.

18. The operating method of claim 17, wherein when the active row and column addresses are the same as the stored addresses as a comparison result, the ECC operation is performed based on the stored data.

* * * * *